United States Patent [19]
Wenham et al.

[11] Patent Number: 5,595,607
[45] Date of Patent: Jan. 21, 1997

[54] BURIED CONTACT INTERCONNECTED THIN FILM AND BULK PHOTOVOLTAIC CELLS

[75] Inventors: Stewart R. Wenham, Illawong; Martin A. Green, Waverley; Michael Y. Taouk, Eastlakes, all of Australia

[73] Assignee: Unisearch Limited, Kensington, Australia

[21] Appl. No.: 244,834

[22] PCT Filed: Dec. 9, 1992

[86] PCT No.: PCT/AU92/00658
§ 371 Date: Sep. 2, 1994
§ 102(e) Date: Sep. 2, 1994

[87] PCT Pub. No.: WO93/12543
PCT Pub. Date: Jun. 24, 1993

[30] Foreign Application Priority Data

Dec. 9, 1991 [AU] Australia .................. PK 9946

[51] Int. Cl.$^6$ ........................... H01L 31/05
[52] U.S. Cl. ............ 136/244; 136/249; 136/255; 136/256
[58] Field of Search ................ 136/244, 249 MS, 136/249 TJ, 255, 256

[56] References Cited

U.S. PATENT DOCUMENTS

| | | | |
|---|---|---|---|
| 3,682,708 | 8/1972 | Bennet | 136/255 |
| 3,994,012 | 11/1976 | Warner, Jr. | 136/246 |
| 4,200,472 | 4/1980 | Chappell et al. | 136/246 |
| 4,283,589 | 8/1981 | Kaplow et al. | 136/255 |
| 4,295,002 | 10/1981 | Chappell et al. | 136/244 |
| 4,595,790 | 6/1986 | Basol | 136/256 |
| 4,933,021 | 6/1990 | Swanson | 136/249 |
| 5,164,019 | 11/1992 | Sinton | 136/249 |

FOREIGN PATENT DOCUMENTS

| | | | |
|---|---|---|---|
| 0038238 | 3/1981 | European Pat. Off. | |
| 2390014 | 1/1979 | France | 136/255 |
| WO8100647 | 3/1981 | WIPO | 136/249 MS |

OTHER PUBLICATIONS

Abstract, Derwent Publications Ltd., EP 38–238, Oct. 21, 1981.

*Primary Examiner*—Aaron Weisstuch
*Attorney, Agent, or Firm*—Morgan & Finnegan, LLP

[57] ABSTRACT

A semiconductor substrate material having a photovoltaic cell, a semiconductor substrate material having an integrated array of at least two photovoltaic cells in electrical series with one another, systems for the production of electricity and method for the production of electricity are disclosed. In the semiconductor substrate material (301) having a photovoltaic cell (303, 304), the photovoltaic cell comprises at least one first type groove (305, 306, 307) having walls doped with a first type dopant (308), the first type groove having a first conducting material in conducting electrical contact with the first type doped walls and at least one second type groove (310, 311, 312) having walls doped with a second type dopant, the second type groove having a second conducting material in conducting electrical contact with the second type doped walls. The first and second type grooves are electrically lined with each other by at least one doped region of linking substrate material (314, 316) selected from the group consisting of a first type region of linking substrate material and a second type doped region of linking substrate material, thereby forming a photovoltaic junction where the doped linking substrate material forms a junction with doped substrate material of different polarity. The first type dopant is of different polarity from the second type dopant.

33 Claims, 12 Drawing Sheets

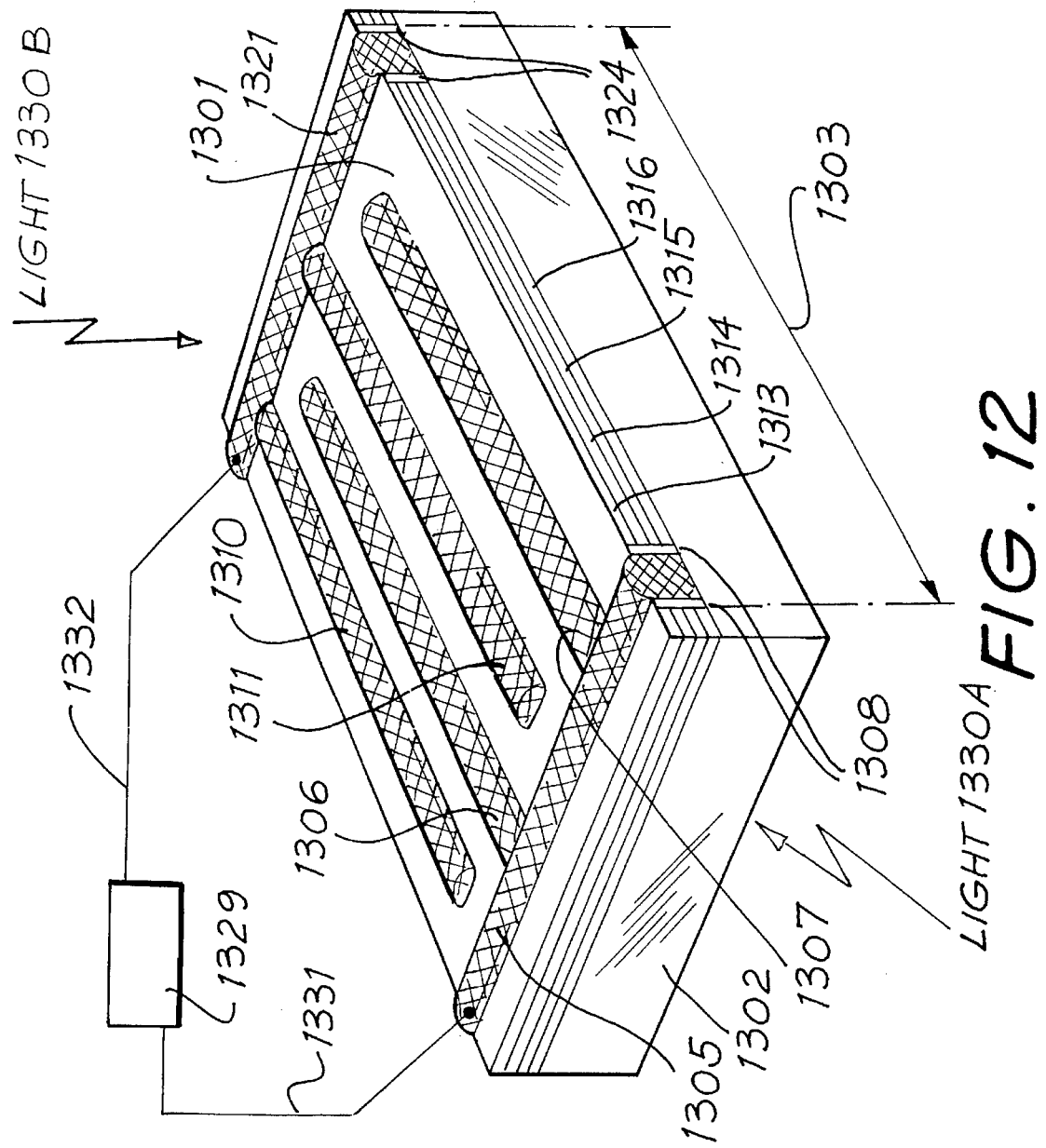

BURIED CONTACT INTERCONNECTED THIN FILM AND BULK PHOTOVOLTAIC CELLS

TECHNICAL FIELD

This invention relates to a semiconductor substrate material having a photovoltaic cell, a semiconductor substrate material having an integrated array of at least two photovoltaic cells in electrical series with one another, systems for the production of electricity, and methods for the production of electricity.

BACKGROUND ART

One proposed method for reducing the cost of photovoltaic energy conversion is to deposit the photovoltaic solar cells in the form of a thin sheet onto a supporting substrate such as glass. Such sheets can be deposited more or less continuously onto a moving substrate or by other methods. Techniques are then required to define individual cells within this deposited sheet and to provide for their electrical interconnection.

It would be advantageous at least from a manufacturing viewpoint if the individual cells in the substrate cell were such that they could be fabricated in a wide range of substrate materials, deposition conditions, and cell designs. It would also be advantageous if the inherent features of cells permitted relatively large area individual cells and large scale integrated arrays of cells to be fabricated.

OBJECTS OF INVENTION

It is an object of this invention to provide a semiconductor substrate material having a photovoltaic cell, and, a semiconductor substrate material having an integrated array of at least two photovoltaic cells in electrical series with one another.

Other objects are to provide systems for the production of electricity and methods for the production of electricity.

DISCLOSURE OF INVENTION

According to a first embodiment of this invention there is provided a semiconductor substrate material having a photovoltaic cells, said photovoltaic cell comprising:

- at least one first type groove having walls doped with a first conductivity dopant, the first type groove having a first conducting material in conducting electrical contact with the first type doped walls;
- at least one second type groove having walls doped with a second conductivity type dopant, the second type groove having a second conducting material in conducting electrical contact with the second type doped walls;
- the first and second type grooves being electrically linked with each other by at least one doped region of linking substrate material selected from the group consisting of a first conductivity type doped region of linking substrate material and a second conductivity type doped region of linking substrate material, thereby forming a photovoltaic junction where the doped linking substrate material forms a junction with doped substrate material of different type conductivity; and
- the first conductivity type dopant being of opposite type from the second conductivity type dopant.

According to a second embodiment of this invention there is provided a semiconductor substrate material having an integrated array of n photovoltaic cells in electrical series with one another, each photovoltaic cell being as defined in the first embodiment;

said n photovoltaic cells in the substrate material being in electrical series with one another, n being greater than or equal to 2, whereby an $m_j-1$)th cell is electrically coupled to an $m_j$th cell via a configuration selected from the group consisting of:

(i) the first conducting material of the first conductivity type groove of an $(m_j-1)$th cell is electrically coupled via interconnecting conducting material with the second conducting material of the second conductivity type groove of an $m_j$th cell; and (ii) the second conducting material of the second conductivity type groove of the $(m_j-1)$th cell is electrically coupled via interconnecting conducting material with the first conducting material of the first conductivity type groove of the $m_j$th cell;

where j is greater than or equal to 2 and less than or equal to n and $m_j$ is equal to j; and wherein first type doped walls of the first conductivity type groove of each photovoltaic cell in the substrate material are substantially electrically insulated from first type doped walls of first conductivity type grooves of other photovoltaic cells in the substrate material and second type doped walls of the second conductivity type groove of each photovoltaic cell in the substrate material are substantially electrically insulated from second type doped walls of second conductivity type grooves of other photovoltaic cells in the substrate material.

According to a third embodiment of this invention there is provided a system for the production of electricity, the system comprising:

(a) a semiconductor substrate material having a photovoltaic cell, in accordance with the first embodiment; and (b) an electrical circuit in electrical communication with the first conducting material of the first conductivity type groove of the cell, and the second conducting material of the second conductivity type groove of the cell.

According to a fourth embodiment of this invention there is provided a system for the production of electricity, the system comprising:

(a) a semiconductor substrate material having an integrated array of n photovoltaic cells in electrical series with one another, in accordance with the second embodiment; and (b) an electrical circuit in electrical communication with conducting material selected from the group consisting of:

(1) the first conducting material of the first conductivity type groove of the first cell, with the proviso that, except via the electrical circuit, the first conducting material is not electrically coupled via interconnecting conducting material with the second conducting material of the second conductivity type groove of another cell in the electrical series, and the second conducting material of the second conductivity type groove of the nth cell, with the proviso that, except via the electrical circuit, the second conducting material is not electrically coupled via interconnecting conducting material with the first conducting material of the first conductivity type groove of another cell in the electrical series; and (2) the second conducting material of the second conductivity type groove of the first cell, with the proviso that, except via the electrical circuit, the second conducting material is not electrically coupled via interconnecting conducting material with the first conducting material of the first conductivity type groove of another cell in the electrical series, and the first conducting material of the first conductivity type groove of the nth cell, with the proviso that, except via the electrical circuit, the first conducting material is not electrically coupled via interconnecting conducting material with the second conducting material of the second conductivity type groove of another cell in the electrical series.

According to a fifth embodiment of this invention there is provided a method for the production of electricity, the method comprising:

illuminating the junction of the system of third embodiment with light capable of generating photocurrents at the junction whereby current flows through the cell thereby loading the electrical circuit.

According to a sixth embodiment of this invention there is provided a method for the production of electricity, the method comprising:

illuminating the junctions of the system of fourth embodiment with light capable of generating photocurrents at the junctions whereby current flows through the n cells thereby loading the electrical circuit.

The number n of cells may be very large, eg 100 and more. Typically an array contains 2 to 5,000 cells, more typically 2 to 500 cells or 2 to 100 cells, and even more typically 6 to 50 cells or 6 to 25 cells.

Shunting diodes may be incorporated in the array in accordance with U.S. Pat. No. 4,323,719, the contents of which are incorporated herein by reference.

Techniques for the formation of grooves in solar cells are described in U.S. Pat. Nos. 4,748,130 and 4,726,850, the contents of which are incorporated herein by reference.

Techniques for the solution growth of silicon films are described in Australian Patent Application No. 31215/89, the contents of which are incorporated herein by reference.

The first and second conductivity type dopants may be n-type, p-type, $n^+$-type, or $p^+$-type dopants with the proviso that the first conductivity type dopant is of opposite type to the second conductivity type dopant.

The first and second conducting materials can be the same or different and can be a metal (eg aluminum), conducting polymer, metal alloy, doped semiconductors or other appropriate conducting material. Generally the conducting material is chosen so that it forms a good electrical contact (preferably an ohmic contact) with the walls of the groove(s) with which it is in contact.

The photovoltaic cells of the invention are particularly useful in converting solar light, light from light sources such as tungsten lamps, fluorescent tubes, photodiodes, or lasers into electricity.

The interconnecting conducting material may be the same or different from the first and second conducting materials and can be a metal, conducting polymer, metal alloy, doped semiconductor, or other appropriate conducting material.

The semiconductor substrate material can be thin films, single crystal, or polycrystalline material. It may be continuous or discontinuous. Thin films may be supported on a substrate or superstrate such as glass, quartz, perspex, or other suitable superstrate. When the superstrate is transparent to the illuminating light the array can be illuminated through the superstrate. The semiconductor substrate material may be used with appropriate antireflection coatings and fabricated using appropriate antireflection geometries.

Typically, the photovoltaic cell is a solar cell. Semiconductor substrate materials such as silicon, germanium, CdTe, $CuInSe_2$, GaAs, AlGaAs, GaP, GaAsP, SiC, InP, and other photovoltaically active semiconductors are particularly suitable for p-n photovoltaic cells and particularly for p-n photovoltaic solar cells.

Significant advantages of the present invention are that is provides a new way of both isolating individual photovoltaic cells in a substrate and of providing electrical interconnection. The technique is applicable to a wider range of materials deposition conditions and cell designs and allows individual cells to be much longer (5–25 cm) than possible with presently established photovoltaic arrays. The photovoltaic arrays can be of unlimited length since the highly conductive conducting material in the grooves can carry current long distances with minimum resistance losses. The substrate or superstrate provides a high lateral resistance between the lower regions of the grooves of different cells to ensure effective isolation of like polarity grooves between individual cells. The technique allows for the use of grooves with tin film photovoltaic layers and provision of metal contacts to the layers via conducting material such as metal in the grooves. A cell can have grooves of opposite polarity interdigitated with each other to minimise photoactive space lost as well as providing a parallel current path to interconnecting grooves which interconnect the photovoltaic cells in series and at the same time providing for low resistance losses.

BRIEF DESCRIPTION OF DRAWINGS

FIG. 12 depicts a thin film semiconductor substrate material on a glass superstrate having a photovoltaic cells in accordance with one embodiment of the invention.

BEST MODE AND OTHER MODES FOR CARRYING OUT THE INVENTION

Figure 1:
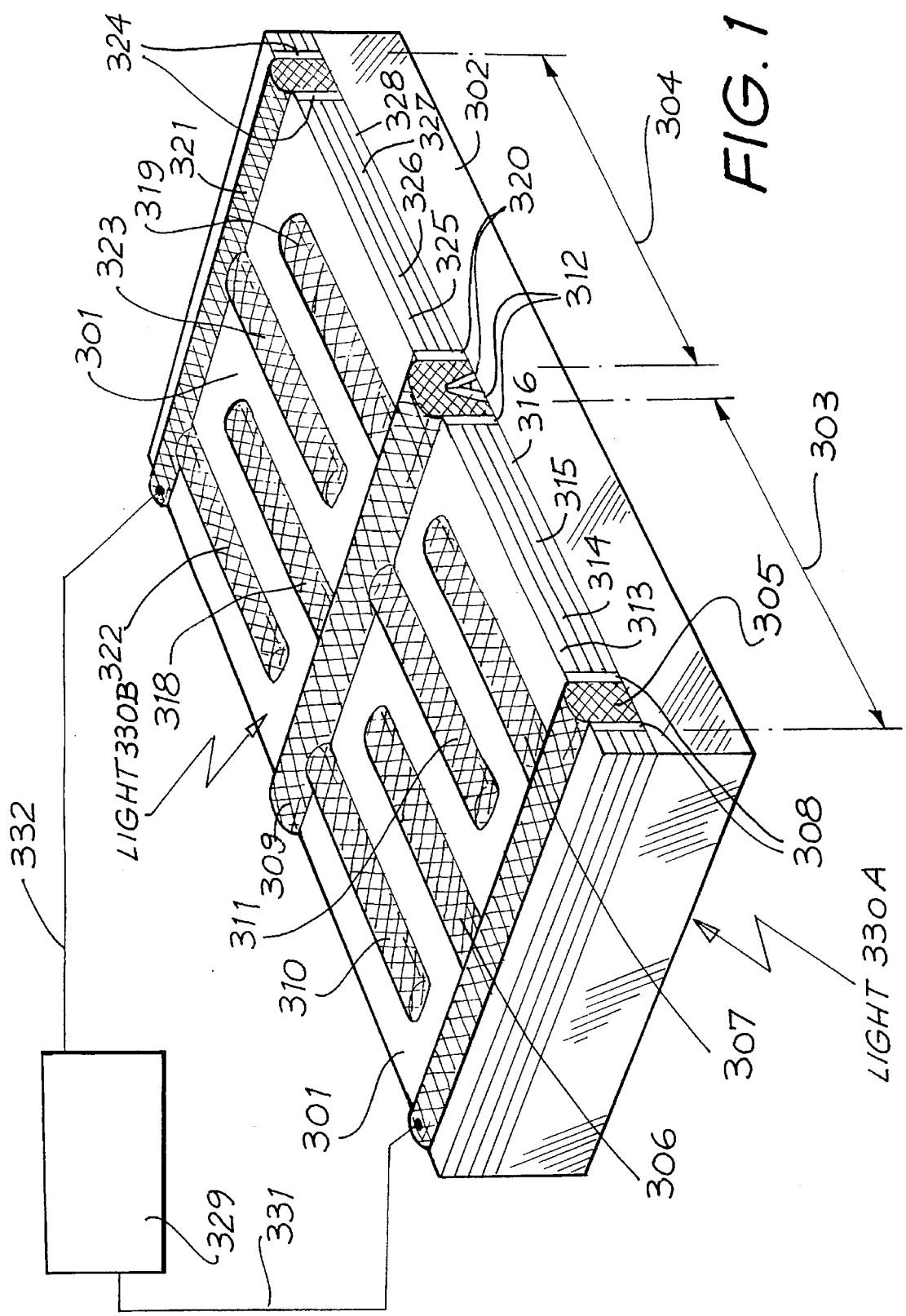
FIG. 1 depicts a thin film semiconductor substrate material on a glass superstrate having an integrated array of only two photovoltaic cells in electrical series with one another in accordance with one embodiment of the invention.

FIG. 1 depicts a thin film semiconductor substrate material 301 on a glass superstrate 302 having an integrated array of two photovoltaic cells 303 and 304 in electrical series with one another. Photovoltaic cell 303 has grooves 305, 306, and 307, each of these grooves having walls doped with a $p^+$-type dopant as shown at 308 for groove 305. Grooves 305, 306, and 307 are filled with metal which is in conducting electrical contact with the respective $p^+$-type doped walls. Photovoltaic cell 303 also has grooves 310 and 311, each of these grooves having walls doped with a $n^+$-type dopant as shown at groove 312, being one of the grooves forming double groove 309 which is also part of cell 303. Double groove 309 comprises groove 312 and groove 320. Groove 320 has walls doped with $p^+$-type dopant and, as already indicated, groove 312 has walls doped with $n^+$-type dopant. Grooves 310 and 311 and double groove 309 are filled with metal which is in conducting electrical contact with their respective $n^+$-type doped walls.

Substrate material 301 in cell 303 includes oxide or other insulating masking layer 313, $p^+$-type layer 314, intrinsic (which can also be n-type or p-type) layer 315, and $n^+$-type layer 316. Grooves 305, 306, and 307 are electrically linked with grooves 309, 310, and 311 by $p^+$-type layer 314, layer 315 (if it is n-type or p-type) and $n^+$-type layer 316, thereby forming a photovoltaic junction where the doped linking substrate material forms a junction with differently doped substrate material of opposite polarity.

Photovoltaic cell 304 has grooves 318 and 319, each of these grooves having walls doped with a $p^+$-type dopant as shown at groove 320 for double groove 309. Grooves 318 and 319 and double groove 309 are filled with metal which is in conducting electrical contact with their respective $p^+$-type doped walls. Photovoltaic cell 304 also has grooves 321, 322, and 323, each of these grooves having walls being doped with an $n^+$type dopant as shown at 324 for groove 321. Grooves 321, 322, and 323 are filled with metal which is in conducting electrical contact with their respective $n^+$-type doped walls.

Substrate material 301 in cell 304 includes optional oxide or other insulating masking layer 325, $p^+$-type layer 326, optional intrinsic (which can also be n-type or p-type) layer 327, and $n^+$-type layer 328. In it simplest form layers 325 and 327 would not be included, which would mean substrate material 301 would have 2-layers, namely, $p^+$-type layer 326, and $n^+$-type layer 328. Grooves 320, 318, and 319 are electrically linked with grooves 321, 322, and 323 by $p^+$-type layer 326, layer 327 (if it is n-type or p-type), and $n^+$-type layer 328, thereby forming a photovoltaic junction where the doped linking substrate material forms a junction with differently doped substrate material of opposite polarity.

Photovoltaic cells 303 and 304 in substrate material 301 are in electrical series with one another since the metal in groove 310 is in electrical contact with the metal in groove 318. Grooves 305, 306, 307, 309, 310, 311, 318, 319, 321, 322, and 323 extend near to or are in contact with glass superstrate 302 so that $n^+$-type doped walls of grooves 309, 310, 311 in cell 303 are substantially electrically insulated from $n^+$-type doped walls of grooves 321, 322, 323 in cell 304 and $p^+$-type doped walls of grooves 305, 306, and 307 in cell 303 are substantially electrically insulated from $p^+$-type doped walls of grooves 320, 318, 319 in cell 304.

The high conductivity of the metal in grooves 305, 306, 307, 309, 310, 311, 318, 319, 321, 322, and 323 permits current to be transported over larger distances than would otherwise be possible, allowing the width of each cell region 303 and 304 to be very large (eg 20 cm).

The metals in grooves 305 and 321 are electrically linked to load 329 via lines 331 and 332.

A preferred substrate material 301 is silicon.

In use, light 330A (typically sunlight) passes through glass superstrate 302 or light 330B passes through insulating layer 325 and light of appropriate wavelength (and which is not reflected) is absorbed by substrate silicon. Current is photogenerated at the light illuminated p-n junctions in cells 303 and 304 and eventually passes through load 329 via lines 331 and 332.

In an alternative arrangement, instead of glass superstrate 302, an intrinsic, $n^-$-type or $p^-$-type single crystal, amorphous, or polycrystalline semiconductor (intrinsic is preferred) superstrate can be used in its place and layers 313, 314, 315, 316, 325, 326, 327, and 328 can be either deposited on substrate 302 or formed from substrate 302 itself. In this instance, unless superstrate 302 is sufficiently thin, cells 303 and 304 are illuminated via surface 301.

Figure 2:
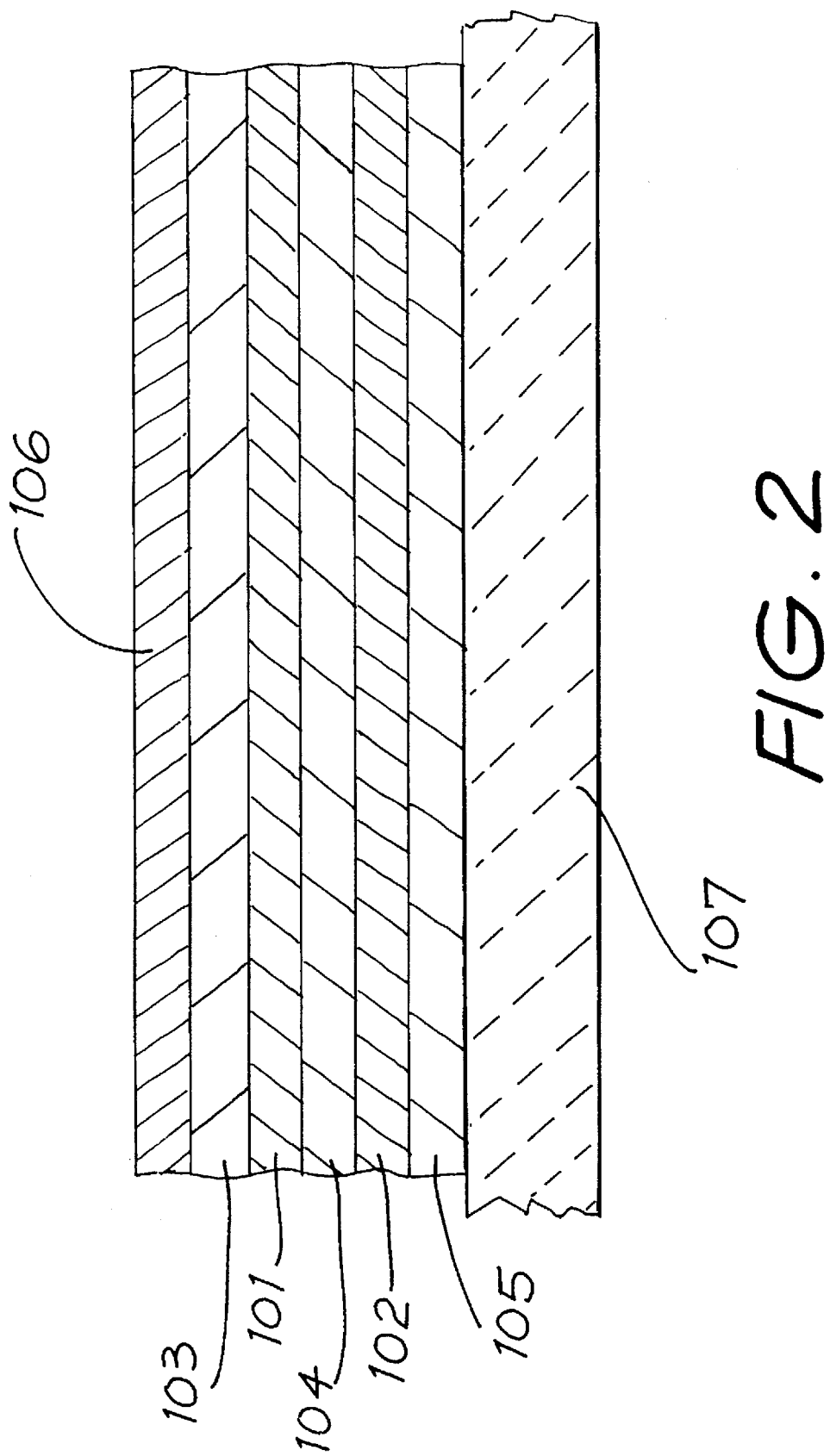
FIG. 2 depicts alternating n-type and p-type thin film silicon layers on a supporting glass superstrate and having an oxide or other insulating masking layer on the top n-type silicon layer representing a structure into which an integrated array of two photovoltaic cells may be formed in accordance with another embodiment of the invention.
Figure 3:
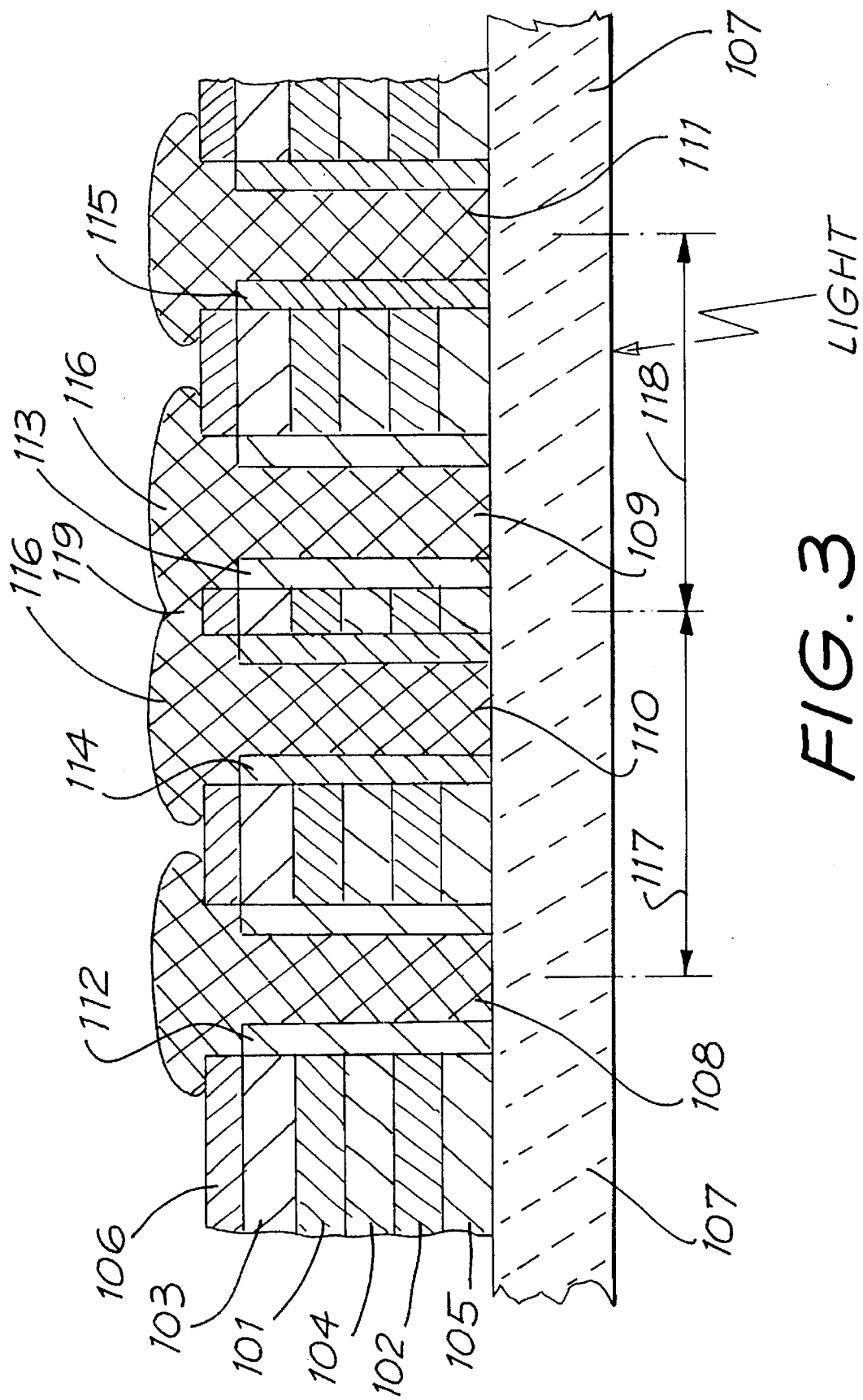
FIG. 3 depicts a cross sectional view of thin film semiconductor substrate material on a glass superstrate of FIG. 2 having an integrated array of two photovoltaic cells in electrical series with one another.

Referring to FIG. 2, thin film silicon layers 101 and 102 (p-type), 103, 104 and 105 (n-type) are deposited from solution in molten metal by known techniques onto supporting glass superstrate 107 (other known appropriate techniques for layer formation may be used). After deposition of these layers from solution in molten metal, oxide or other insulating masking layer 106 is either grown or deposited on the surface of layer 103. Suitable techniques for growing layer 106 include the rapid thermal annealing of the surface region of the grown layer in an oxygen ambient or the physical vapor deposition or the chemical vapor deposition of such a layer. A laser is then used to form grooves 108 and 109, through layers 101, 102, 103, 104, 105, and 106 to, or approaching, glass superstrate 107 as shown in FIG. 3. Other techniques such as mechanical scribing or grooving or chemical etching or various combinations thereof may be used to form the grooves. Additional n-type material is then deposited onto the entire exposed layer including the walls of grooves 108 and 109 from metal solution. When additional n-type material is deposited from metal solution the doped layer may be deposited in such way that it forms selectively in grooved areas since generally growth is more difficult to nucleate on amorphous oxide or other insulating masking layers. When additional n-type material is deposited from metal solution or otherwise onto the entire exposed layer, dopant diffusion is prevented in areas covered by the oxide or other insulating masking layer but not in the remainder of the grooves. After the deposition, growth or diffusion of the n-type material into the walls of grooves 108 and 109 to form n$^+$-type doped groove walls 112 and 113 and the removal of unwanted deposited layers, if required by the details of the particular sequence, an oxide or other insulating masking layer is grown or deposited onto the walls of grooves 108 and 109 (and onto the remaining surface layer, if appropriate). Grooves 110 and 111 are then formed using laser etching, plasma etching, mechanical scribing or chemical etching or various combinations thereof through to, or approaching, glass superstrate 107. Additional p-type material is then deposited onto the walls of grooves 110 and 111 in an analogous way to that of the n-type material as described above to form p$^+$-type doped groove walls 114 and 115. The oxide or other insulating masking layer is then removed from grooves 108 and 109. Metal is then deposited to fill grooves 108, 109, 110, and 111 as shown at 116 by a technique such as electroless plating to form adjacent cells 117 and 118. Adjacent cells 117 and 118 are interconnected at 119. The p and n regions of grooves 110 and 109 respectively are physically located very close to each other.

In FIG. 3 layers 101, 102, 103, 104, 105, and 106 constitute a thin film semiconductor substrate material on a glass superstrate 107 having an integrated array of two photovoltaic cells 117 and 118 in electrical series with one another. Photovoltaic cell 118 has groove 111 having walls doped with a p$^+$-type dopant as shown at 115. Groove 111 is filled with metal which is in conducting electrical contact with p$^+$-type doped walls 115. Photovoltaic cell 118 also has groove 109 having walls 113 doped with a n$^+$-type dopant). Groove 109 is filled with metal which is in conducting electrical contact with n$^+$-type doped walls 113.

Substrate material in cell 118 includes oxide or other insulating layer 106, and alternating p-type layers 101 and 102 and n-type layers 103, 104, and 105. Grooves 109 and 111 are electrically linked by layers 101, 102, 103, 104, and 105, thereby forming a photovoltaic junction where the doped linking layers form junctions with differently doped substrate material of opposite polarity.

Photovoltaic cell 117 has groove 110 having walls 114 doped with a p$^+$-type dopant. Groove 110 is filled with metal which is in conducting electrical contact with p$^+$-type doped walls 114. Photovoltaic cell 117 also has groove 108 having walls 112 doped with a n$^+$-type dopant. Groove 108 is filled with metal which is in conducting electrical contact with n$^+$-type doped walls 112.

Substrate material in cell 117 includes oxide or other insulating layer 106, and alternating p-type layers 101 and 102 and n-type layers 103, 104, and 105. Grooves 108 and 110 are electrically linked by layers 101, 102, 103, 104, and 105, thereby forming a photovoltaic junction where the doped linking layers form junctions with differently doped substrate material of opposite polarity.

Photovoltaic cells 117 and 118 are in electrical series with one another since the metal in groove 110 is in electrical contact with the metal in groove 109 at 119. Grooves 108, 110, 109, and 111 extend near to glass superstrate 107 so that n$^+$-type doped walls of groove 108 are substantially electrically insulated from n$^+$-type doped walls of groove 109 in cell 118 and any other n$^+$-type doped walls of grooves of cell 118 or other cells in layers 101, 102, 103, 104, 105, and 106. Also, p$^+$-type doped walls of grooves of cell 118 or other cells in layers 101, 102, 103, 104, 105, and 106.

The high conductivity of the metal in grooves 108, 110, 109, and 111 permits current to be transported over larger distances than would otherwise be possible, allowing the distance between grooves 108 and 110 for cell 117 and the distance between grooves 109 and 111 for cell 118 to be very large (eg 10–20 cm).

Figure 4:
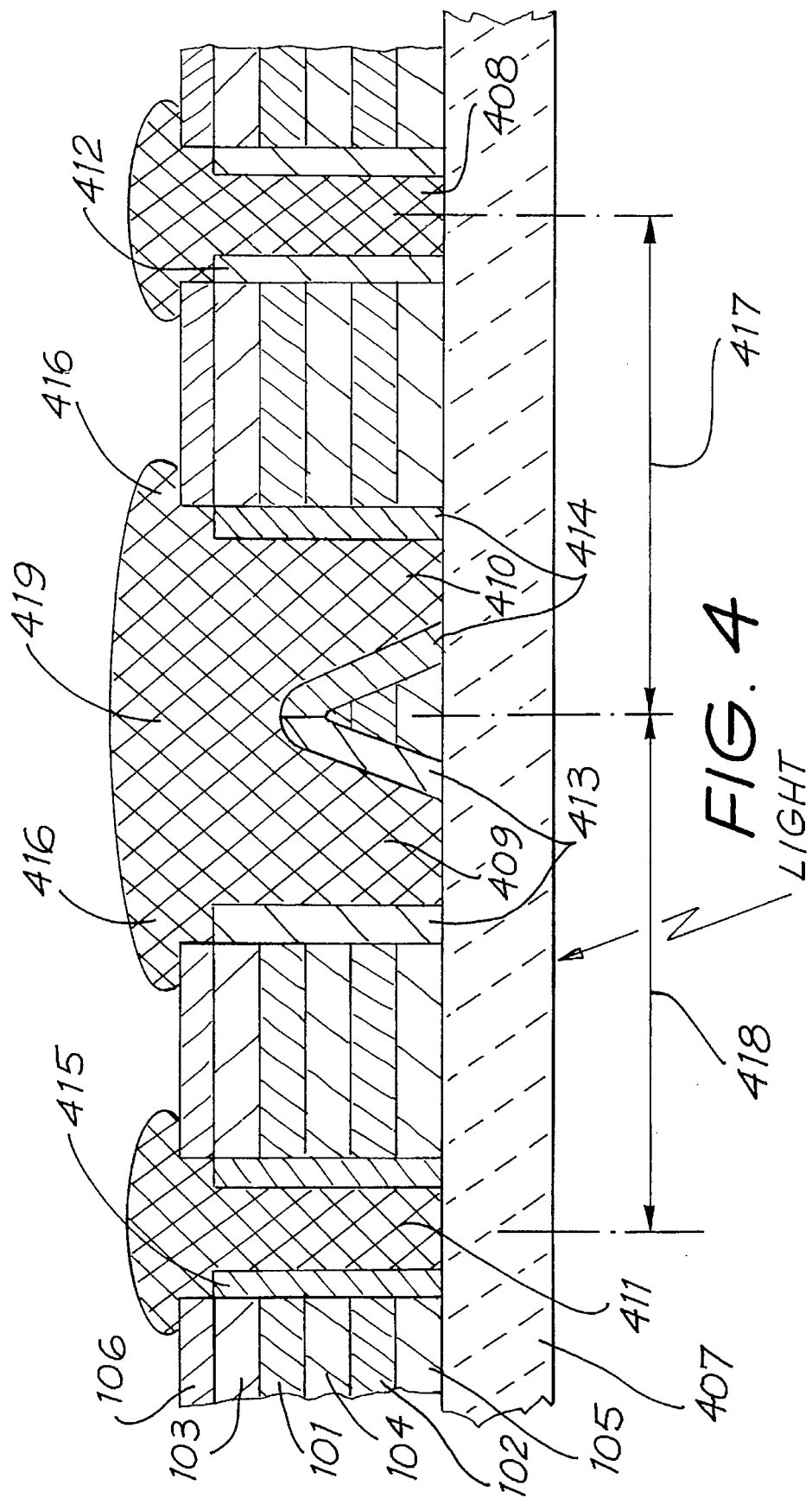
FIG. 4 depicts a cross sectional view of another type of thin film semiconductor substrate material on a glass superstrate of FIG. 2 having an integrated array of two photovoltaic cells in electrical series with one another.

Referring to FIG. 4, thin film silicon layers 101 and 102 (p-type), 103, 104, and 105 (n-type) are deposited from solution in molten metal or other known techniques onto supporting glass superstrate 407. After deposition of these layers from solution in molten metal or equivalent, oxide or other insulating masking layer 106 is either grown or deposited on the surface of layer 103. Suitable techniques for growing layer 106 include spraying, screen printing, the rapid thermal annealing of the surface region of the grown layer in an oxygen ambient or the physical vapor deposition or the chemical vapor deposition of such a layer. A laser is then used to form grooves 408 and 409, through layers 101, 102, 103, 104, 105, and 106 to, or approaching, glass superstrate 407. Other techniques such as mechanical scribing or grooving or chemical etching or various combinations thereof may be used to form the grooves. Additional n-type material is then deposited onto the entire exposed layer including the walls of grooves 408 and 409 from metal solution or other appropriate or equivalent technique. When additional n-type material is deposited from metal solution the doped layer may be deposited in such way that it forms selectively in grooved areas since generally growth is more difficult to nucleate on amorphous oxide or other insulating masking layers. When additional n-type material is deposited from metal solution or otherwise onto the entire exposed layer, dopant diffusion is prevented in areas covered by the oxide or other insulating masking layer. Diffusion of the n-type material into the walls of grooves 408 and 409 forms n$^+$-type doped groove walls 412 and 413. The deposited layers are then removed if required by the details of the particular sequence. An oxide or other insulating masking layer is then grown or deposited onto the walls of grooves 408 and 409 (and onto the remaining surface layer, if appropriate). Grooves 410 and 411 are then formed using laser etching, plasma etching, mechanical scribing, or chemical etching or various combinations thereof through to, or approaching, glass superstrate 407. Additional p-type material is then deposited onto the walls of grooves 410 and 411 in an analogous ways to that of the n-type material as described above to form p$^{30}$-type doped groove walls 414 and 415. The oxide or other insulating masking layer is then removed from grooves 408 and 409. Metal is then deposited to fill grooves 408, 409, 410, and 411 by a technique such as electroless plating to form adjacent cells 417 and 418. Adjacent cells 417 and 418 are interconnected at 419 where the p and n wall regions 414 and 413 meet.

In FIG. 4 layers 101, 102, 103, 104, 105, and 106 constitute a thin film semiconductor substrate material on a glass superstrate 407 having an integrated array of two photovoltaic cells 417 and 418 in electrical series with one another. Photovoltaic cell 418 has groove 411 having walls doped with a p$^+$-type dopant as shown at 415. Groove 411 is filled with metal which is in conducting electrical contact with p$^+$-type doped walls 415. Photovoltaic cell 418 also has groove 409 having walls 413 doped with a n$^+$-type dopant. Groove 409 is filled with metal which is in conducting electrical contact with n$^+$-type doped walls 413.

Substrate material in cell 418 includes oxide or other insulating layer 106, and alternating p-type layers 101 and 102 and n-type layers 103, 104, and 105. Grooves 409 and 411 are electrically linked by layers 101, 102, 103, 104, and 105 thereby forming a photovoltaic junction where the doped linking layers form junctions with differently doped substrate material of opposite polarity.

Photovoltaic cell 417 has groove 410 having walls 414 doped with a $p^+$-type dopant. Groove 410 is filled with metal which is in conducting electrical contact with $p^+$-type doped walls 414. Photovoltaic cell 417 also has groove 408 having walls 412 doped with an $n^+$-type dopant. Groove 408 is filled with metal which is in conducting electrical contact with $n^+$-type doped walls 412.

Substrate material in cell 417 includes oxide or other insulating layer 106, and alternating p-type layers 101 and 102 and n-type layers 103, 104, and 105. Grooves 408 and 410 are electrically linked by layers 101, 102, 103, 104, and 105 thereby forming a photovoltaic junction where the doped linking layers form junctions with differently doped substrate material of opposite polarity.

Photovoltaic cells 417 and 418 are in electrical series with one another since the metal in groove 410 is in electrical contact with the metal in groove 409. Grooves 408, 410, 409, and 411 extend near to glass superstrate 407 so that $n^+$-type doped walls of groove 408 are substantially electrically insulated from $n^+$-type doped walls of groove 409 in ell 418 and any other $n^{-30}$-type doped walls of grooves of cell 418 or other cells in layers 101, 102, 103, 104, 105, and 106 and $p^+$-type doped walls 414 of groove 410 are substantially electrically insulated from $p^+$-type doped walls of groove of cell 418 or other cells in layers 101, 102, 103, 104, 105, and 106.

The high conductivity of the metal in grooves 408, 410, 409, and 411 permits current to be transported over larger distances than would otherwise be possible, allowing the distance between grooves 411 and 409 in cell 418 and the distance between grooves 410 and 408 in cell 417 to be very large (eg 20 cm).

The W-shaped double grooves depicted in FIGS. 1 and 4 are produced by a combination of scribing and chemical etching whereas the U shaped grooves of FIG. 3 are produced by scribing alone or by scribing and etching wherein the etching is only slight and sufficient only for purposes of cleaning or when the crystallographic orientation is such as to produce the U shape after substantial amounts of appropriate etching. Crystallographic orientation may be selected to give almost any groove shape in conjunction with appropriate scribing and chemical etching.

Figure 5:
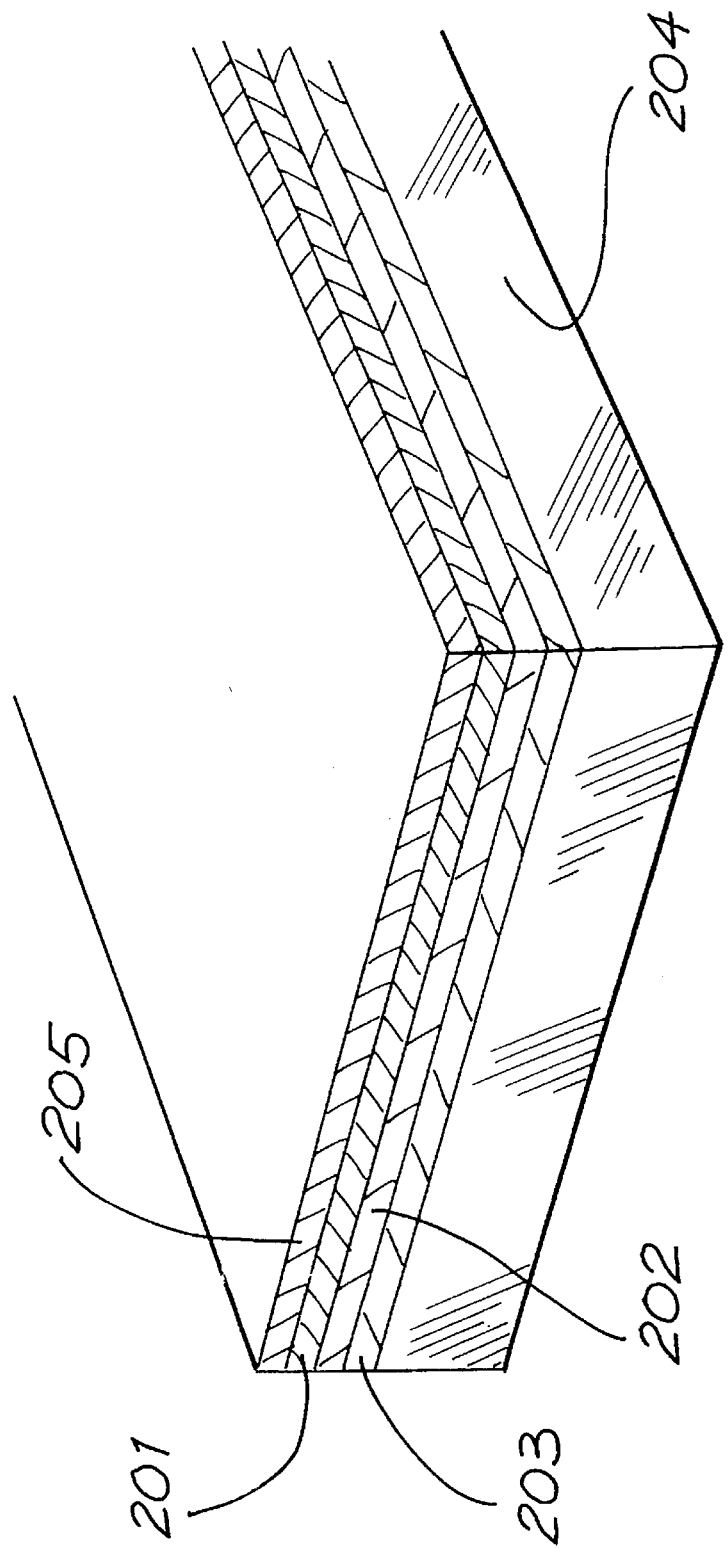
FIG. 5 depicts $p^+$-type layer, i layer, and $n^+$-type thin film silicon layers on a supporting glass superstrate and having an oxide or other insulating masking layer on top of the $p^+$-type silicon layer.
Figure 6:
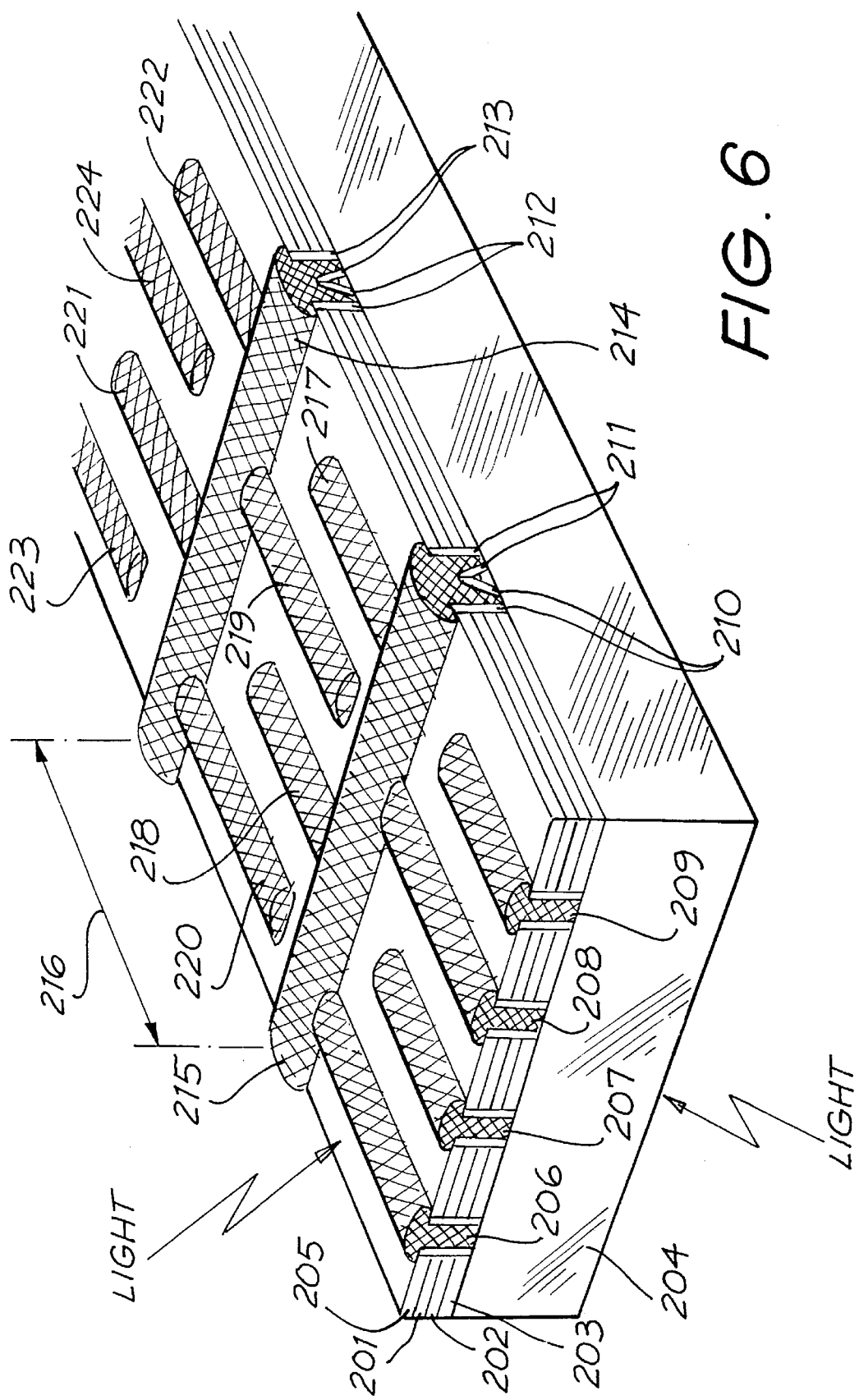
FIG. 6 depicts a perspective cross sectional view of thin film semiconductor substrate material on a glass superstrate of FIG. 5 having an integrated array of photovoltaic cells in electrical series with one another.

Referring to FIG. 5, thin film silicon layers 201 ($p^+$-type), 202 (i or n-type) and 203 ($n^+$-type) are deposited from solution in molten metal or other known techniques onto a supporting glass superstrate 204. As an alternative to layers 201, 202, and 203 of the polarities shown in FIG. 5, layers 201, 202, and 203 of FIG. 5 can be of opposite polarities to those depicted. After deposition of these layers from solution in molten metal, oxide or other insulating layer 205 is either grown or deposited on the surface of layer 201. Suitable techniques for growing layer 205 include the rapid thermal annealing of the surface region of the grown layer in an oxygen ambient or the physical vapor deposition or the chemical vapor deposition of such layer. A laser is then used to form grooves 206, 208, 210, 212, 219, 220, 223, and 224 through layers 201, 202, 203, and 205 to, or approaching, glass superstrate 204 as shown in FIG. 6. Other techniques such as plasma etching, mechanical scribing, or grooving or chemical etching or various combinations thereof may be used to form the grooves, Additional n-type material is then deposited onto the entire exposed layer including the walls of grooves 206, 208, 210, 212, 219, 220, 223, and 224 from metal solution or from doped layers otherwise deposited thereon. When additional n-type material is deposited from metal solution the doped layer may be deposited in such way that it forms selectively in grooved areas since generally growth is more difficult to nucleate ion amorphous oxide or other insulating masking layers. When additional n-type material is deposited from metal solution or otherwise onto the entire exposed layer, dopant diffusion is prevented in areas covered by the oxide or other insulating masking layer. Diffusion of the n-type material into the walls of grooves 206, 208, 210, 212, 219, 220, 223, and 224 forms $n^+$-type doped groove walls. After removal of deposited layers, if required by the details of the particular sequence, an oxide or other insulating layer or masking layer is grown or deposited onto the walls of grooves 206, 208, 210, 212, 219, 220, 223, and 224 (and onto the remaining surface layer, of appropriate). Grooves 207, 209, 211, 217, 218, 213, 221, and 222 are then formed using laser etching, plasma etching, mechanical scribing, or chemical etching or various combination thereof through to, or approaching, glass superstrate 204. Additional p-type material is then deposited onto the walls of grooves 207, 209, 211, 217, 218, 213, 221, and 222 in an analogous way to that of the n-type material as described above to form $p^+$-type doped groove walls. Grooves 210 and 211 together form W-shaped double groove 215 and grooves 212 and 213 together form W-shaped double groove 214. By appropriate geometrical layout as shown in FIG. 6, the $n^+$-type regions and $p^+$-type regions can either act as sites for defining the boundaries of individual cells (grooves 210 and 212 for $n^+$-type and grooves 211 and 213 for $p^+$-type) or merely as contact regions for such cells (grooves 206, 208, 219, 220, 223, and 224 for $n^+$-type and grooves 207, 209, 217, 218, 221, and 222 for $p^+$-type). The masking layer is then removed from grooves 206, 208, 210, 212, 219, 220, 223, and 224. Metal is then deposited to fill or partially fill grooves 206, 208, 210, 212, 219, 220, 223, 224, 207, 209, 211, 217, 218, 213, 221, and 222 by a technique such as electroless plating. The high conductivity of such deposited metal allows current to be transported over larger distances than would otherwise be possible, allowing the width of each cell region 216 to be very large (eg 20 cm) as shown in FIG. 6. Adjacent cells are interconnected where metal in adjacent grooves (eg grooves 210 and 211) meets.

Figure 7:
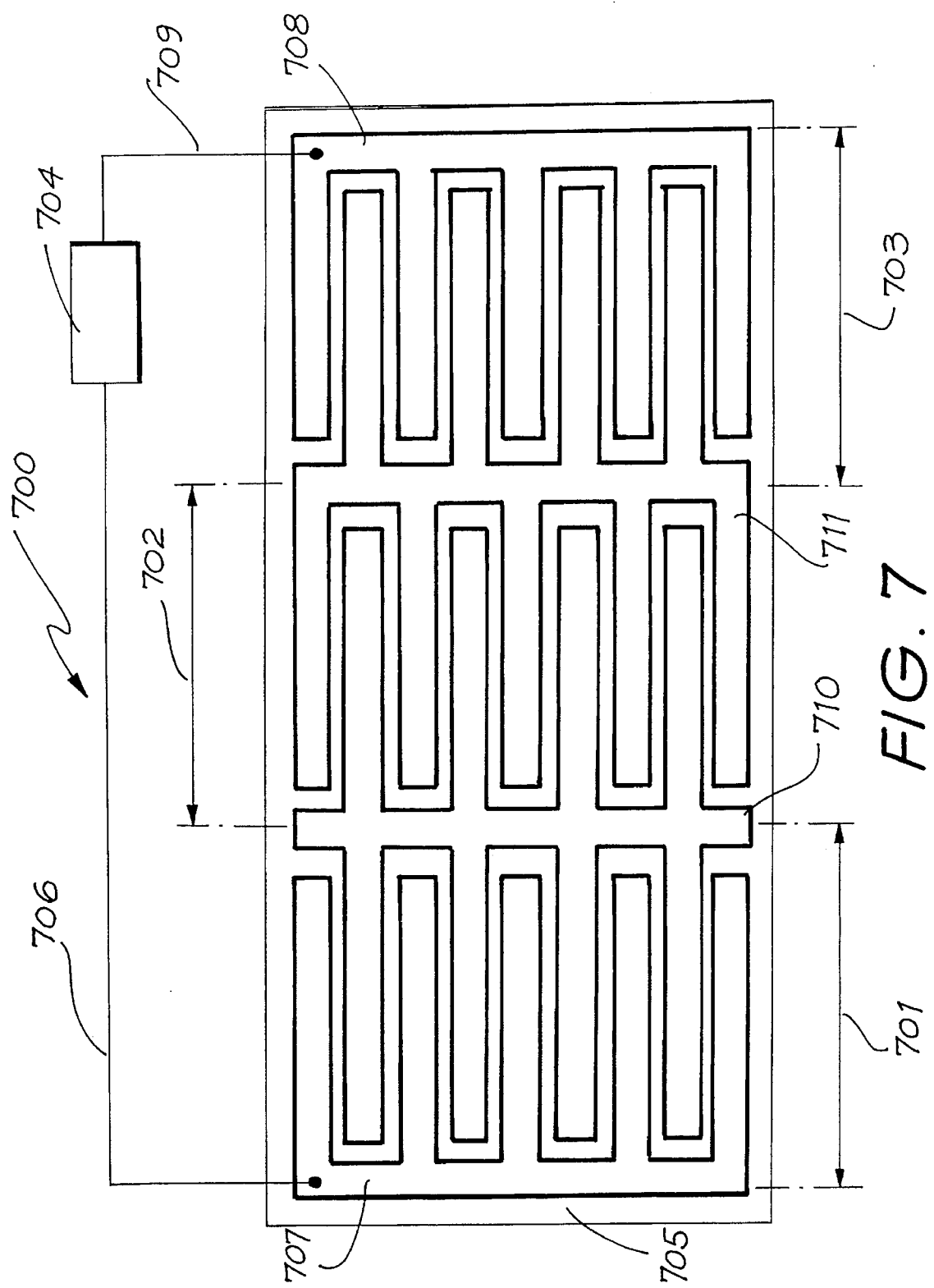
FIG. 7 depicts a plan view of a thin film semiconductor substrate material on a glass superstrate having an integrated array of three photovoltaic cells in electrical series with one another in accordance with a further embodiment of the invention.

It will be apparent from FIG. 6 that multiple photovoltaic cells in series can be constructed on a single superstrate or substrate. In this regard, for example, reference is made to FIG. 7 which depicts a plan view of a system 700 for the production of electricity comprising a thin film semiconductor substrate material 705 on a glass superstrate (not shown) having an integrated array of three photovoltaic cells 701, 702, and 703 in electrical series with one another. In system 700, load 704 is in electrical communication with conducting material 707 of a first conductivity type groove of cell 701 via line 706 and a second conducting material 708 of a second conductivity type groove of cell 703 via line 709 except via lines 706 and 709 and load 704. The areas 707, 708, 710 and 711 in system 700 depict conducting material in grooves of the types shown in FIG. 6 and are not drawn to scale. In system 700, conducting material 707 is not electrically coupled via interconnecting conducting material with conducting material of a second conductivity type groove of cell 702 or 703. In addition, in system 700 conducting material 708 is not electrically coupled via interconnecting conducting material with conducting material of a first conductivity type groove of cell 702 or 701 except via lines 706 and 709 and load 704.

Figure 8:
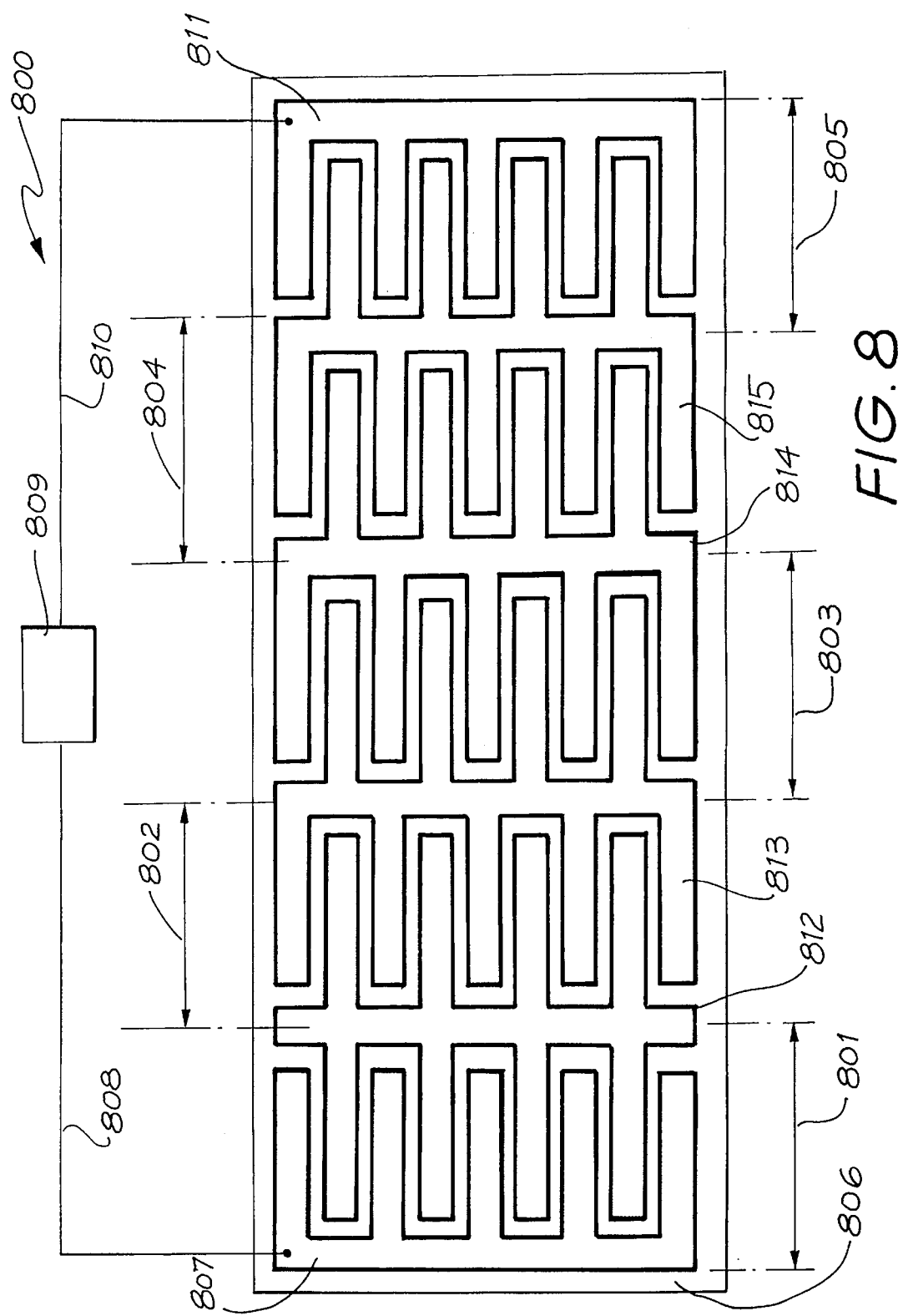
FIG. 8 depicts a plan view of a thin film semiconductor substrate material on a glass superstrate having an integrated array of five photovoltaic cells in electrical series with one another in accordance with another embodiment of the invention.

As another example that multiple photovoltaic cells in series can be constructed on a single superstrate or substrate, reference is made to FIG. 8 which depicts a plan view of a system 800 for the production of electricity comprising a thin film semiconductor substrate material 806 on a glass superstrate (not shown) having an integrated array of five photovoltaic cells 801, 802, 803, 804, and 805 in electrical series with one another. In system 800, load 809 is in electrical communication with conducting material 807 of a first conductivity type groove of cell 801 via line 808 and a second conducting material 811 of a second conductivity type groove of cell 805 via line 810. The areas 807, 812, 813, 814, 815, and 811 in system 800 depict conducting material in grooves of the types shown in FIG. 6 and are not drawn to scale. In system 800, conducting material 807 is not electrically coupled via interconnecting conducting material with conducting material of a second type groove of cell 802, 803, 804, or 805 except via lines 808 and 810 and load 809. In addition, in system 800 conducting material 811 is not electrically coupled via interconnecting conducting material with conducting material of a first conductivity type groove of cell 804, 803, 802, or 801 except via lines 808 and 810 and load 809.

Figure 9:
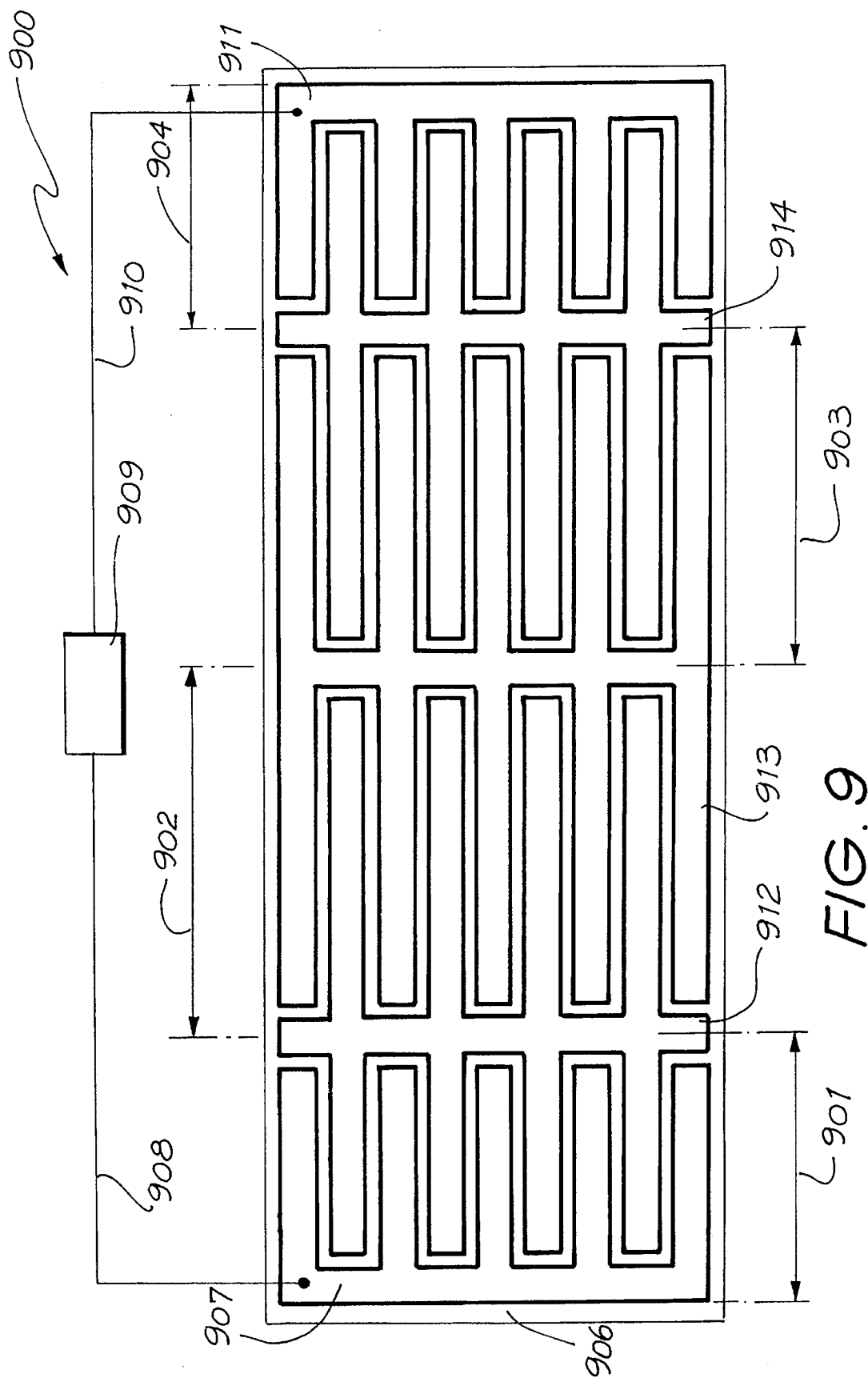
FIG. 9 depicts a plan view of a thin film semiconductor substrate material on a glass superstrate having an integrated array of four photovoltaic cells in electrical series with one another in accordance with another embodiment of the invention.

As a further example that multiple photovoltaic cells in series can be constructed on a single superstrate or substrate, reference is made to FIG. 9 which depicts a plan view of a system 900 for the production of electricity, comprising a thin film semiconductor substrate material 906 on a glass superstrate (not shown) having an integrated array of four photovoltaic cells 901, 902, 903, and 904 in electrical series with one another. In system 900, load 909 is in electrical communication with conducting material 907 of a first conductivity type groove of cell 901 via line 908 and a second conducting material 911 of a second conductivity type groove of cell 904 via line 910. The areas 907, 912, 913, 914, and 911 in system 900 depict conducting material in grooves of the types shown in FIG. 4 and are not drawn to scale. In system 900, conducting material 907 is not electrically coupled via interconnecting conducting material with conducting material of a second conductivity type groove of cell 902, 903, or 904 except via lines 908 and 910 and load 909. In addition, in system 900 conducting material 911 is not electrically coupled via interconnecting conducting material with conducting material of a first conductivity type groove of cell 903, 902, or 901 except via lines 908 and 910 and load 909.

Figure 10:
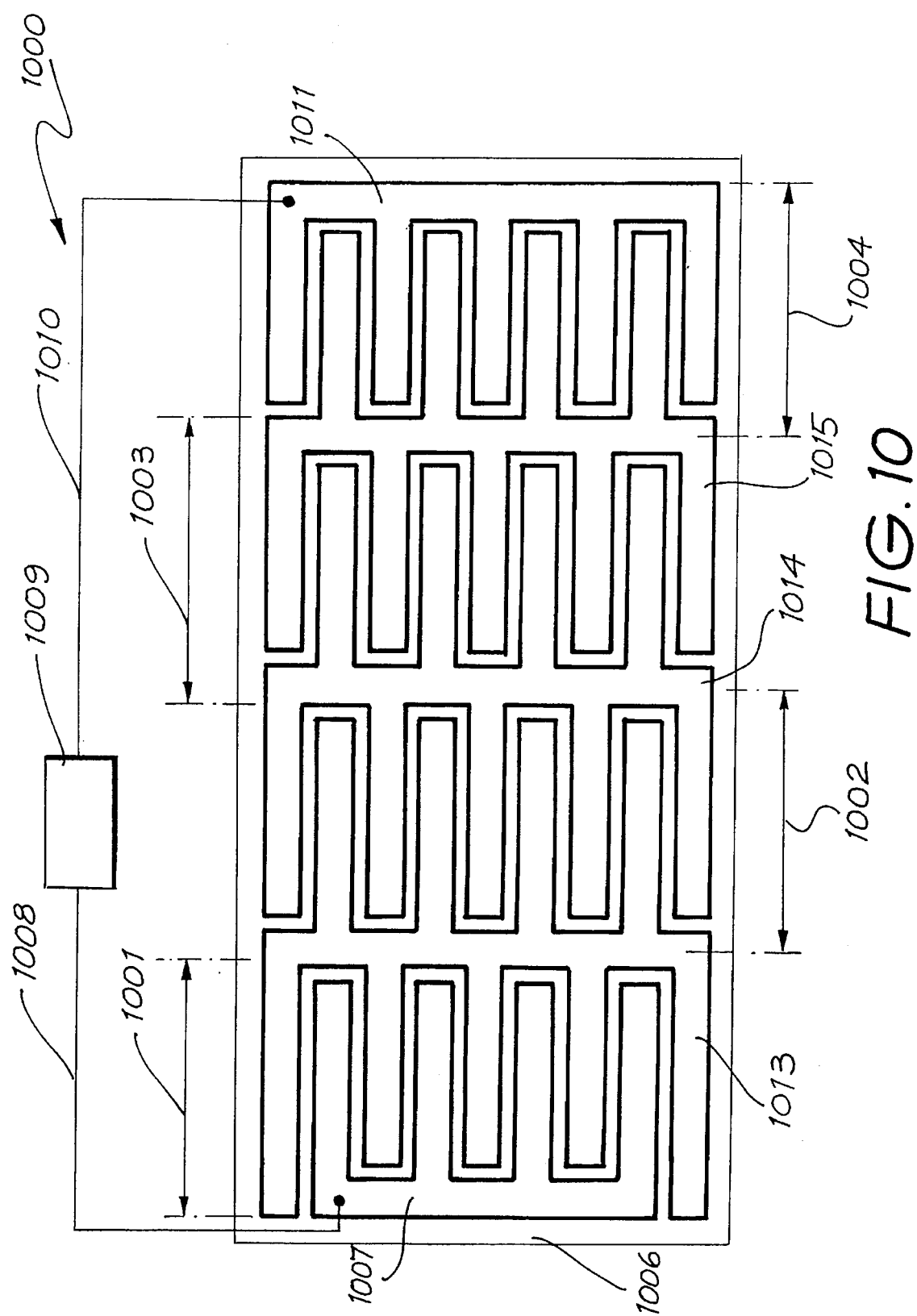
FIG. 10 depicts a plan view of a thin film semiconductor substrate material on a glass superstrate having an integrated array of four photovoltaic cells in electrical series with one another in accordance with another embodiment of the invention.

As yet a further example that multiple photovoltaic cells in series can be constructed on a single superstrate or substrate, reference is made to FIG. 10 which depicts a plan view of a system 1000 for the production of electricity comprising a thin film semiconductor substrate material 1006 on a glass superstrate (not shown) having an integrated array of four photovoltaic cells 1001, 1002, 1003, and 1004 in electrical series with one another. In system 1000, load 1009 is in electrical communication with conducting material 1007 of a first conductivity type groove of cell 1001 via line 1008 and a second conducting material 1011 of a second conductivity type groove of cell 1004 via line 1010. The areas 1007, 1013, 1014, 1015 and 1011 in system 1000 depict conducting material in grooves of the types shown in FIG. 3 and are not drawn to scale. In system 1000, conducting material 1007 is not electrically coupled via interconnecting conducting material with conducting material of a second conductivity type groove of cell 1002, 1003, or 1004 except via lines 1008 and 1010 and load 1009. In addition, in system 1000 conducting material 1011 is not electrically coupled via interconnecting conducting material with conducting material of a first conductivity type groove of cell 1003, 1002, or 1001 except via lines 1008 and 1010 and load 1009.

Figure 11:
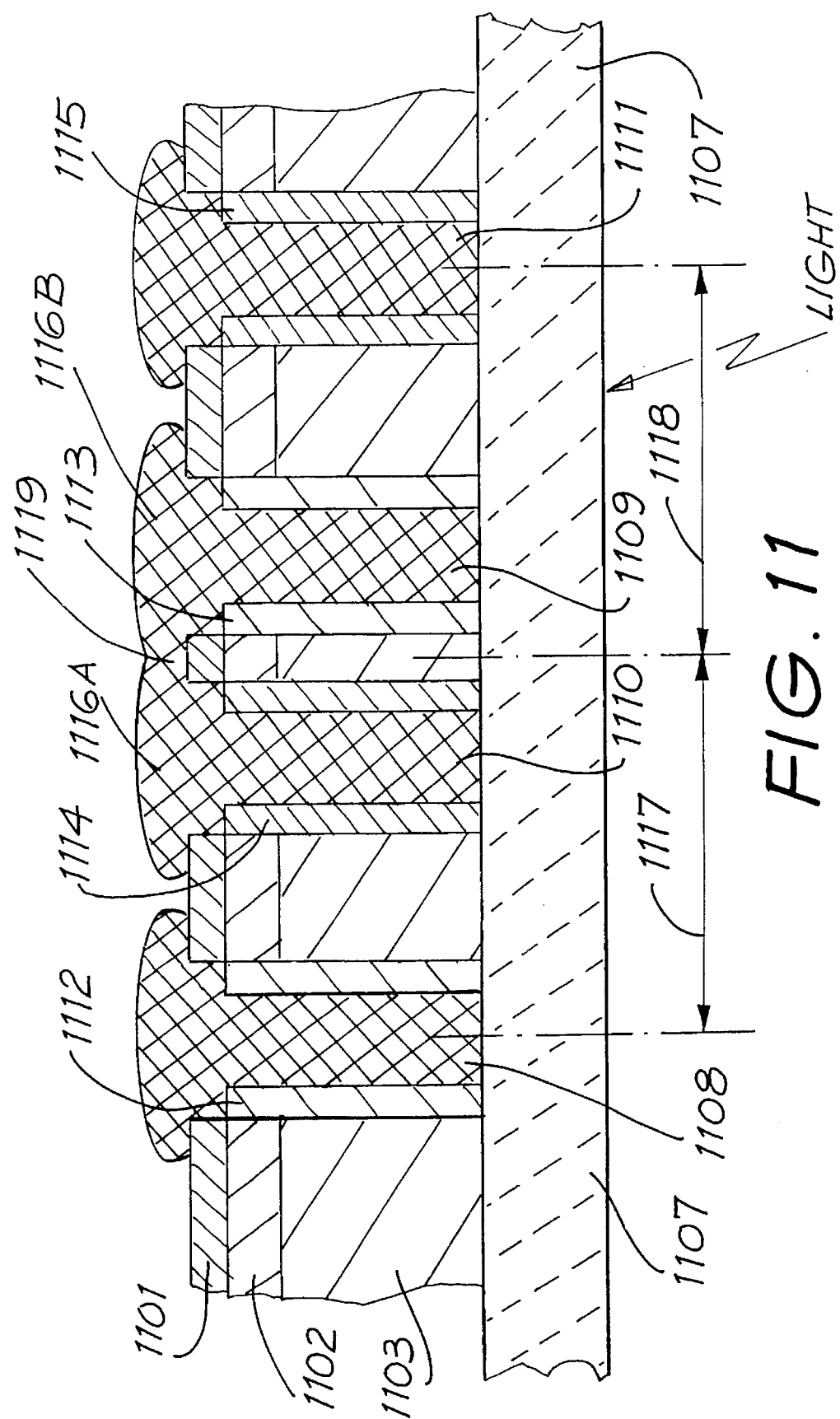
FIG. 11 depicts a cross sectional view of thin film semiconductor substrate material ion a glass superstrate having an integrated array of two photovoltaic cells in electrical series with one another.

One of the advantages of the approach of FIGS. 3 or 4 is that the thin film semiconductor substrate material may simply have one n-type layer and one p-type layer electrically interlinking the $p^+$-type and $n^+$-type grooves in each cell or may have a plurality of n-type layers and p-type layers which alternate with one another as shown in FIGS. 3 and 4, for example, electrically interlinking the $p^+$-type and $n^+$-type grooves in each cell. For instance, there may be 20 or more n-type layers and 20 or more p-type layers which alternate with one another as shown in FIGS. 3 and 4, for example, electrically interlinking the $p^+$-type and $n^+$-type grooves in each cell. It is appropriate in view of the relative simplicity of a photovoltaic cell having one n-type layer and one p-type layer electrically interlinking the $p^+$-type and $n^+$-type grooves in each cell to describe such a cell in more detail with reference to FIG. 11. In FIG. 11 layers 1101, 1102, and 1103 constitute a thin film semiconductor substrate material on a glass superstrate 1107 having an integrated array of two photovoltaic cells 1117 and 1118 in electrical series with one another. Photovoltaic cell 1118 has groove 1111 having walls doped with a $p^+$-type dopant as shown at 1115. Groove 1111 is filled with metal which is in conducting electrical contact with $p^+$-type doped walls 1115. Photovoltaic cell 1118 also have groove 1109 having walls 1113 doped with a $n^+$-type dopant). Groove 1109 is filled with metal which is in conducting electrical contact with $n^+$-type doped walls 1113.

Substrate material in cell 1118 includes oxide or other insulating layer 1101, n-type layer 1102, and p-type layer 1103. Grooves 1109 and 1111 are electrically linked by layers 1102 and 1103, thereby forming a photovoltaic junction where the doped linking layers form junctions with differently doped substrate material of opposite polarity.

Photovoltaic cell 1117 has groove 1110 having walls 1114 doped with a $p^+$-type dopant. Groove 1110 is filled with metal which is in conducting electrical contact with $p^+$-type doped walls 1114. Photovoltaic cell 1117 also has groove 1108 having walls 1112 doped with a $n^+$-type dopant. Groove 1108 is filled with metal which is in conducting electrical contact with $n^+$-type doped walls 1112.

Substrate material in cell 1117 includes oxide or other insulating layer 1101, n-type layer 1102, and p-type layer 1103. Grooves 1108 and 1110 are electrically linked by layers 1102 and 1103, thereby forming a photovoltaic junction where the doped linking layers form junctions with differently doped substrate material of opposite polarity.

Photovoltaic cells 1117 and 1118 are in electrical series with one another since the metal 1116A in groove 1110 is in electrical contact with the metal 1116B in groove 1109 via metal bridge 1119. Grooves 1108, 1110, 1109, and 1111 extend near to glass superstrate 1107 so that $n^+$-type doped walls of groove 1108 are substantially electrically insulated from $n^+$-type doped walls of groove 1109 in cell 1118 and any other $n^+$-type doped walls of grooves of cell 1118 or other cells in layers 1101, 1102, and 103. Also $p^+$-type doped walls 1114 of groove 1110 are substantially electrically insulated from $p^+$-type doped walls 115 of groove 1111 in cell 1118 and any other $p^+$-type doped walls of grooves of cell 1118 or other cells in layers 1101, 1102, and 1103.

The high conductivity of the metal in grooves 1108, 1110, 1109, and 1111 permits current to be transported over larger distances than would otherwise be possible, allowing the distance between grooves 1108 and 1110 for cell 1117 and the distance between grooves 1109 and 1111 for cell 1118 to be very large (eg 10–20 cm).

FIG. 12 depicts a thin film semiconductor substrate material 1301 on a glass superstrate 1302 having thereon photovoltaic cell 1303. Photovoltaic cell 1303 has grooves 1305, 1306, and 1307, each of these grooves having walls doped with a p$^+$-type dopant as shown at 1308 for groove 1305. Grooves 1305, 1306, and 1307 are filled with metal which is in conducting electrical contact with their respective p$^+$-type doped walls. Photovoltaic cell 1303 also has grooves 1310 and 1311 each of these grooves having walls doped with a n$^+$-type dopant as shown for groove 1321 and 1324. Grooves 1310, 1311 and 1321 are filled with metal which is in conducting electrical contact with their respective n$^+$-type doped walls.

Substrate material 1301 in cell 1303 includes oxide or other insulating masking layer 1313, p$^+$-type layer 1314, intrinsic (which can also be n-type or p-type) layer 1315 and n$^+$-type layer 1316. Grooves 1305, 1306 and 1307 are electrically linked with grooves 1310, 1311, and 1321 by p$^+$-type layer 1314, layer 1315 (if it is n-type or p-type) and n$^+$-type layer 1316 thereby forming a photovoltaic junction where the doped linking substrate material forms a junction with differently doped substrate material of opposite polarity. In its simplest form, layers 1314 and 1314 would not be included which would mean substrate material 1301 would have 2-layers, namely, p$^+$-type layer 1314, and n$^+$-type layer 1316. The high conductivity of the metal in grooves 1305, 1306, 1307, 1310, 1311, and 1321 permits current to be transported over larger distances than would otherwise be possible, allowing the width of cell region 1303 to be very large (eg 20 cm).

The metal in grooves 1305 and 1321 are electrically linked to load 1329 via lines 1331 and 1332.

A preferred substrate material 1301 is silicon.

In use, light 1330A (typically sunlight) passes through glass superstrate 1302 or light 1330B passes through insulating layer 1313 and light of appropriate wavelength (and which is not reflected) is absorbed by substrate silicon. Current is photogenerated at the light illuminated p-n junctions in cell 1303 and eventually passes through load 1329 via lines 1331 and 1332.

In an alternative arrangement, instead of glass superstrate 1302, an intrinsic, n$^-$-type or p$^-$-type single crystal, amorphous, or polycrystalline semiconductor (intrinsic is preferred) superstrate can be used in its place and layers 1313, 1314, 1315, and 316 can be either deposited on substrate 1302 or formed from substrate 1302 itself. In this instance, unless superstrate 1302 is sufficiently thin, the cell 1303 is to be illuminated via surface 1301.

It will be readily apparent to a person skilled in the art from the systems depicted in FIGS. 1, 3, 4, 6, 7, 8, 9, 10, and 11 that systems with a large number of photovoltaic cells in electrical series with one another can be constructed in an analogous manner to those depicted.

It will be recognized by persons skilled in the art that numerous variations and modifications may be made to the invention as described without departing from the spirit or scope of the invention as broadly described. For example, the techniques described are not only applicable to silicon and amorphous silicon substrates, but are applicable to any semiconducting substrate which may be used in a photovoltaic device.

Deposited layers and substrates may not be substantially flat as shown but may include texture or patterns to reduce reflection from cell surfaces and also trap light into the cell.

We claim:

1. A solar cell having:

a plurality of alternate p-type and n-type doped semiconductor material layers defining one or more semiconductor junctions; and two contact structures formed in a plurality of grooves having semiconductor surfaces and extending to contact the plurality of doped layers, the semiconductor surfaces of the groove of a first of the contact structures being doped with an n-type dopant, with the semiconductor surfaces of the groove of the second of the contact structures being doped with a p-type dopant and each groove containing a conducting material in conducting electrical contact with the respective doped surfaces of the groove, the first contact structure providing an electrical connection with the n-type doped layers and the second contact structure providing an electrical connection with the p-type doped layers.

2. The solar cell as claimed in claim 1, wherein at least two p-type layers are separated by an n-type layer.

3. The solar cell as claimed in claim 1, wherein at least two n-type layers are separated by a p-type layer.

4. The solar cell as claimed in claim 1, wherein the plurality of doped layers include at least five alternate p-type and n-type semiconductor material layers.

5. The solar cell as claimed in claim 1, wherein at least one pair of adjacent p-type and n-type layers are separated by an intrinsic layer or a lightly doped n-type or p-type layer.

6. The solar cell as claimed in claim 1, wherein the p-type doped layers are doped as p-type or p$^+$-type layers, and wherein the n-type doped layers are doped as n-type or n$^+$-type layers.

7. The solar cell as claimed in claim 1, wherein the semiconductor material is a material selected from the group consisting of a thin film material, single crystal material, and polycrystalline material.

8. The solar cell as claimed in claim 7, wherein the material is in the form of a thin film on a support substrate or a support superstrate.

9. The solar cell as claimed in claim 8, wherein the support substrate or support superstrate is glass, quartz, or perspex.

10. The solar cell as claimed in claim 1, wherein the semiconductor material is a material selected from the group consisting of silicon, germanium, CdTe, CuInSe2, GaAs, AlGaAs, GaP, GaAsP, SiC, and InP.

11. An array of series connected solar cells, the array including m solar cells as defined in claim 1, the semiconductor material of each cell being effectively isolated from the semiconductor material of the remaining cells other than by way of direct interconnection of their respective contact structures, the first contact structure of the jth cell being connected to the second contact structure of the (j−1)th cell in the array, where $1 < j \leq m$.

12. The array of claim 11, wherein the grooves of the first and second contact structures of each cell are in a pattern of parallel fingers joined by an interconnecting bus, the fingers of the first contact structure being interengaged with the fingers of the second structure.

13. The array of claim 12, herein the bus of the first contact structure of the jth cell is in close proximity, substantially parallel, and connected to the bus of the second contact structure of the (j−1)th cell of the array to achieve series connection of adjacent cells.

14. The array of claim 13, wherein the conducting material of connected busses of adjacent cells is integrated into a single bus conductor.

15. The array as claimed in claim 11, wherein the number m of cells is from 2 to 5000 cells.

16. The array as claimed in claim 11, wherein the number n of cells is from 6 to 50 cells.

17. An array of series connected solar cells, the array including m solar cells, each cell having a plurality of alternate p-type and n-type doped semiconductor material layers defining regions of alternating dopant type providing one or more semiconductor junctions, and two contact structures formed in grooves having semiconductor surfaces and extending to contact each of the doped layers, semiconductor surfaces of the groove of a first of the contact structures being doped with an n-type dopant, semiconductor surfaces of the groove of the second of the contact structures being doped with a p-type dopant and each groove containing a conducting material in conducting electrical contact with the respective doped surfaces of the groove, the first contact structure providing an electrical connection with the n-type doped layers and the second contact structure providing an electrical connection with the p-type doped layers, the semiconductor material of each cell being effectively isolated from the semiconductor material of the remaining cells other than by way of direct interconnection of their respective contact structures, and the first contact of the ith cell being connected to the second contact structure of the (i−1)th cell in the array, where $1<i<m$.

18. The array of claim 17, wherein the grooves of the first and second contact structures of each cell are in a pattern of parallel fingers joined by an interconnecting bus, the fingers of the first contact structure being interdigitated fingers of the second structure.

19. The array as claimed in claim 18 wherein the bus of the first contact structure of the ith cell is in close proximity, and connected to the bus of the second contact structure of the (j−1)th cell of the array to achieve series connection of adjacent cells.

20. The array of claim 19, wherein the conducting material of connected busses of adjacent cells is integrated into a single bus conductor.

21. The array as claimed in claim 17, wherein the number m of cells is from 2 to 5000 cells.

22. The array as claimed in claim 17, wherein the number n of cells is from 6 to 50 cells.

23. The array as claimed in claim 17, wherein each of the m photovoltaic cells is a p-n photovoltaic solar cell.

24. The array as claimed in claim 17, wherein each of the m photovoltaic cells is a n-p photovoltaic solar cell.

25. The array as claimed in claim 17, wherein at least two p-type layers of each cell are separated by an n-type layer.

26. The array as claimed in claim 17, wherein at least two n-type layers of each cell are separated by a p-type layer.

27. The array as claimed in claim 17, wherein the plurality of doped layers of each cell include at least five alternate p-type and n-type semiconductor material layers.

28. The array as claimed in claim 17, wherein at least one pair of adjacent p-type and n-type layers of each cell are separated by an intrinsic layer or a lightly doped n-type or p-type layer.

29. The array as claimed in claim 17, wherein the p-type doped layers of each cell are doped as p-type or $p^+$-type layers, and wherein the n-type doped layers of each cell are doped as n-type or $n^+$-type layers.

30. The array as claimed in claim 17, wherein the semiconductor material of each cell is a material selected from the group consisting of a thin film material, single crystal material, and polycrystalline material.

31. The array as claimed in claim 30, wherein the semiconductor material of each cell is in the form of a thin film on a support substrate or a support superstrate.

32. The array as claimed in claim 31, wherein the support substrate or support superstrate is glass, quartz, or perspex.

33. A system for the production of electricity, the system including:

(a) a solar cell cell having:
  (i) a plurality of alternate p-type and n-type doped semiconductor material layers defining at least one semiconductor junction; and
  (ii) two contact structures formed in groove extending to contact the plurality of doped layers, semiconductor surfaces of the groove of a first of the contact structures being doped with an n-type dopant, semiconductor surfaces of the groove of the second of the contact structures being doped with a p-type dopant and each groove containing a conducting material in conducting electrical contact with the respective doped surfaces of the groove, the first contact structure providing an electrical connection with the n-type doped layers and the second contact structure providing an electrical connection with the p-type doped layers; and (b) an electrical circuit in electrical communication with the conducting material of the first contact structure of the cell, and the conducting material of the second contact structure of the cell.

* * * * *